United States Patent [19]

Lai et al.

[11] Patent Number: 5,229,311
[45] Date of Patent: Jul. 20, 1993

[54] METHOD OF REDUCING HOT-ELECTRON DEGRADATION IN SEMICONDUCTOR DEVICES

[75] Inventors: Stefan K. Lai, Belmont; Daniel N. Tang, San Jose; Simon Y. Wang, Sunnyvale; Susan L. Kao, Los Altos; Baylor B. Triplett, La Honda, all of Calif.

[73] Assignee: Intel Corporation, Santa Clara, Calif.

[21] Appl. No.: 859,264

[22] Filed: Mar. 25, 1992

Related U.S. Application Data

[63] Continuation of Ser. No. 327,302, Mar. 22, 1989, abandoned.

[51] Int. Cl.$^5$ .............................. H01L 21/70
[52] U.S. Cl. .............................. 437/43; 437/52; 437/192; 437/200
[58] Field of Search .............. 43/29, 40, 41, 43, 52, 43/192, 200, 228

[56] References Cited

U.S. PATENT DOCUMENTS

| | | | |
|---|---|---|---|
| 3,879,746 | 4/1975 | Fournier | 357/71 |
| 4,121,241 | 10/1978 | Drake et al. | 357/68 |
| 4,267,012 | 5/1981 | Pierce et al. | 437/194 |
| 4,288,256 | 9/1981 | Ning | 148/1.5 |
| 4,375,817 | 3/1983 | Tonnel | 437/41 |
| 4,516,145 | 5/1985 | Chang | 357/42 |
| 4,566,026 | 1/1986 | Lee | 357/71 |
| 4,570,328 | 2/1986 | Price et al. | 148/DIG. 147 |
| 4,672,740 | 6/1987 | Shirai et al. | 437/200 |
| 4,707,721 | 11/1987 | Ang et al. | 357/54 |
| 4,743,564 | 5/1988 | Sato et al. | 437/192 |
| 4,782,380 | 11/1988 | Shankar et al. | 437/190 |
| 4,784,973 | 9/1988 | Stevens et al. | 437/192 |
| 4,804,636 | 2/1989 | Groover et al. | 437/192 |
| 4,807,016 | 2/1989 | Douglas | 437/192 |
| 4,814,293 | 3/1989 | Van Oekel | 437/192 |
| 4,822,753 | 4/1989 | Pintchovski et al. | 437/192 |
| 4,824,521 | 4/1989 | Kulkarni et al. | 156/643 |
| 4,829,024 | 5/1989 | Klein et al. | 437/192 |
| 4,830,974 | 5/1989 | Chang et al. | 437/43 |
| 4,845,050 | 7/1989 | Kim et al. | 437/192 |
| 4,870,033 | 9/1989 | Holta et al. | 437/192 |
| 4,920,073 | 4/1990 | Wei et al. | 437/192 |
| 4,931,411 | 5/1990 | Tigelaar et al. | 437/41 |

FOREIGN PATENT DOCUMENTS

| | | |
|---|---|---|
| 20227549 | 7/1987 | European Pat. Off. . |
| 0260232 | 11/1988 | European Pat. Off. . |
| 276878 | 12/1987 | Japan . |
| 2156586 | 10/1985 | United Kingdom . |
| 0284794 | 1/1988 | United Kingdom . |
| 2206234 | 12/1988 | United Kingdom . |
| 8100487 | 2/1981 | World Int. Prop. O. . |

OTHER PUBLICATIONS

Ting, et al.; "The Use of Titanium-Based Contact Barrier Layers in Silicon Technology"; *Thin Solid Films*; vol. 96; pp. 327-345; 1982.

Dieleman, et al.; "Plasma Effluent Etching: Selective and Non-damaging"; *Solid State Technology*; vol. 27; No. 4; pp. 191-196 1984.

IEEE Electron Device Letters, vol. 9, No. 5, May 1988; Shuo-Tung Chang, et al., "Reduced Oxide Charge Trapping and Improved Hot-Electron Reliability in Submicrometer MOS Devices Fabricated by Titanium Salicide Process".

IEEE Electron Device Letters, vol. EDL-6, No. 7, Jul. 1985; F. C. Hsu, et al., "Effect of Final Annealing on Hot-Electron-Induced MOSFET Degradation".

IEDM Tech. Digest, pp. 22-25; (1988); S. Yoshida, et al., "Improvement of Endurance To Hot Carrier Degradation By Hydrogen Blocking P-SiO".

*Primary Examiner*—Tom Thomas
*Attorney, Agent, or Firm*—Blakely, Sokoloff, Taylor & Zafman

[57] ABSTRACT

A method of reducing the degradation effects associated with avalanche injection or tunnelling of hot-electrons in a field-effect semiconductor device is disclosed. The method of the present invention includes covering the active regions of the semiconductor device with a protective titanium barrier layer which is deposited directly underneath the ordinary metalization layers used for connecting the devices to bit and word lines within an array. Inclusion of the titanium barrier layer in a flash memory device results in a substantial improvement in the erasetime push-out and reduces excess charge loss normally associated with hot-electron devices.

20 Claims, 3 Drawing Sheets

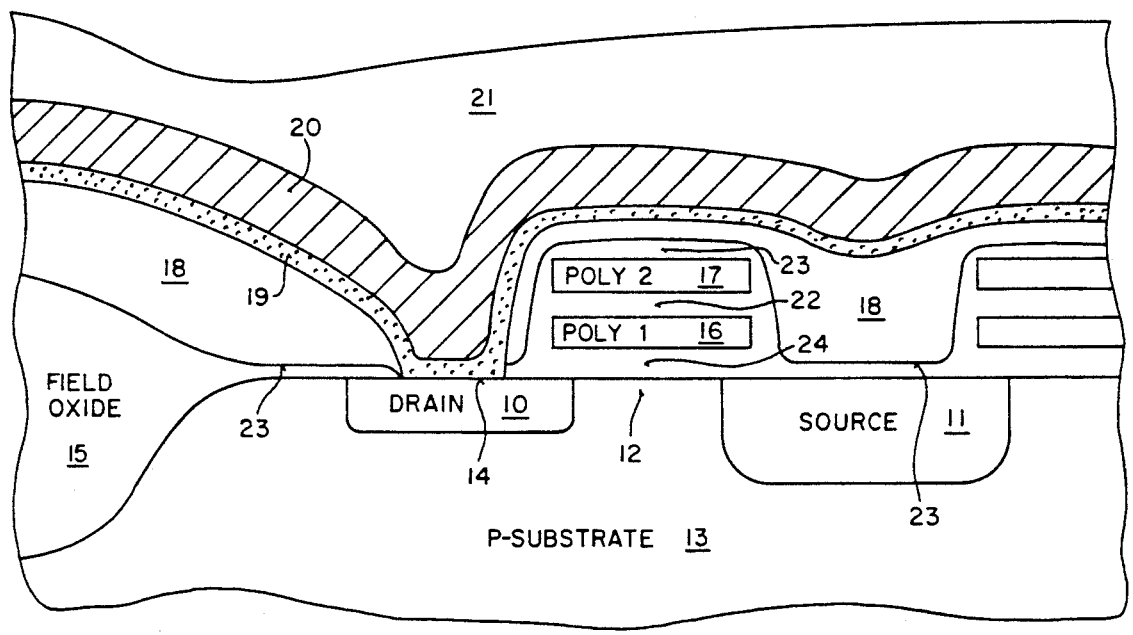
FIG_1
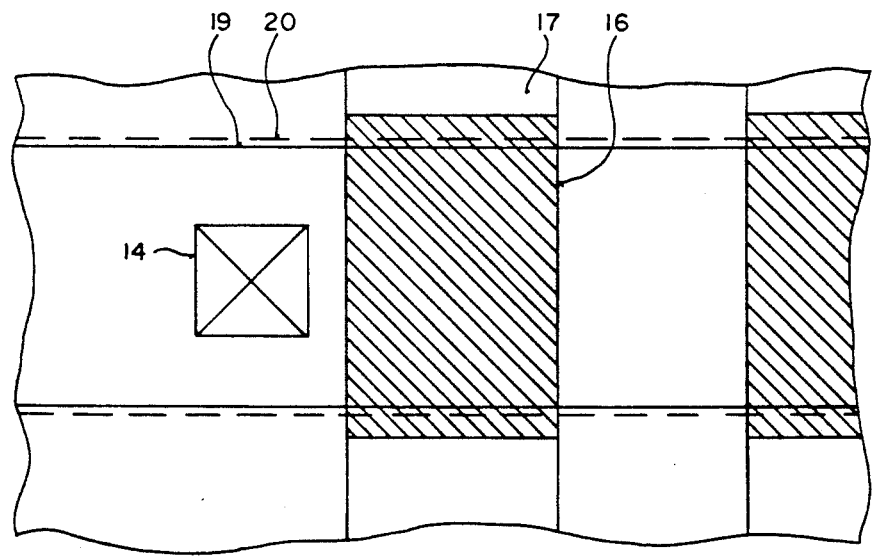
FIG_2

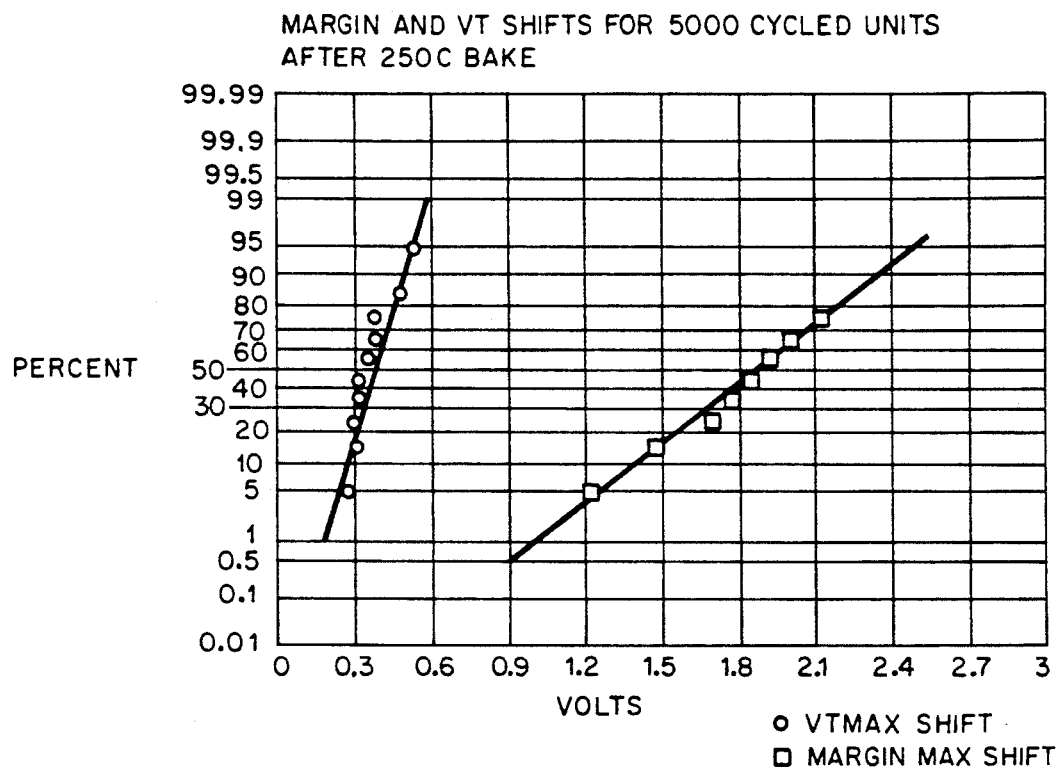
FIG_3A (PRIOR ART)
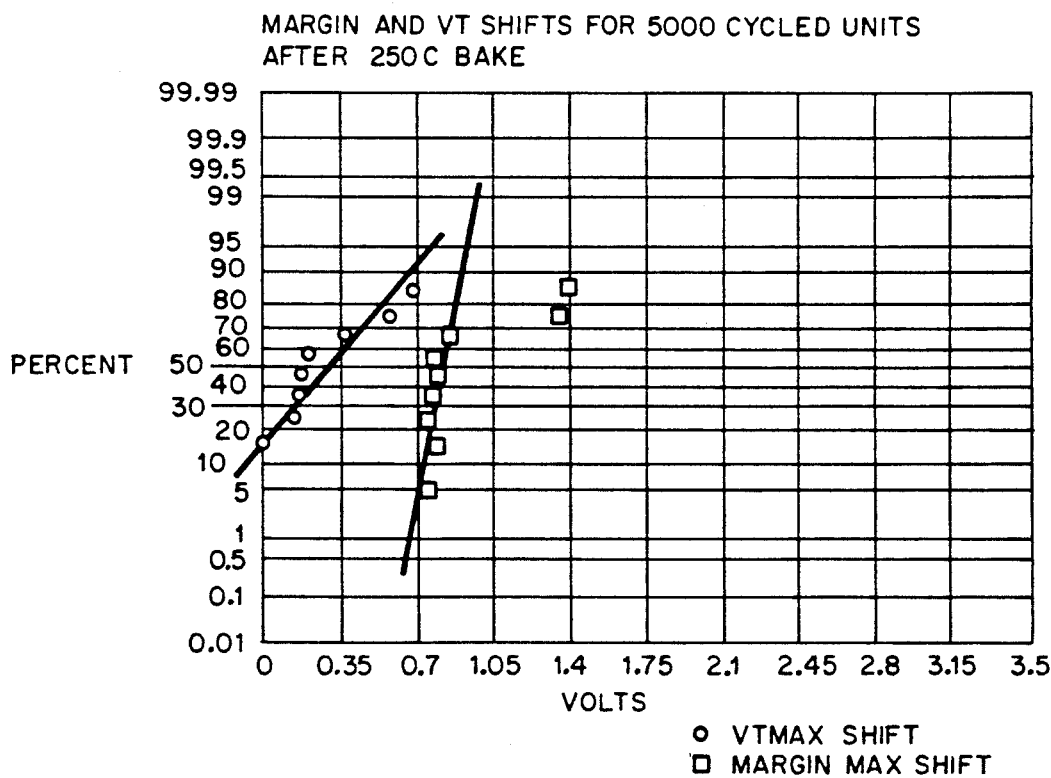
FIG_3B

FIG_4A (PRIOR ART)
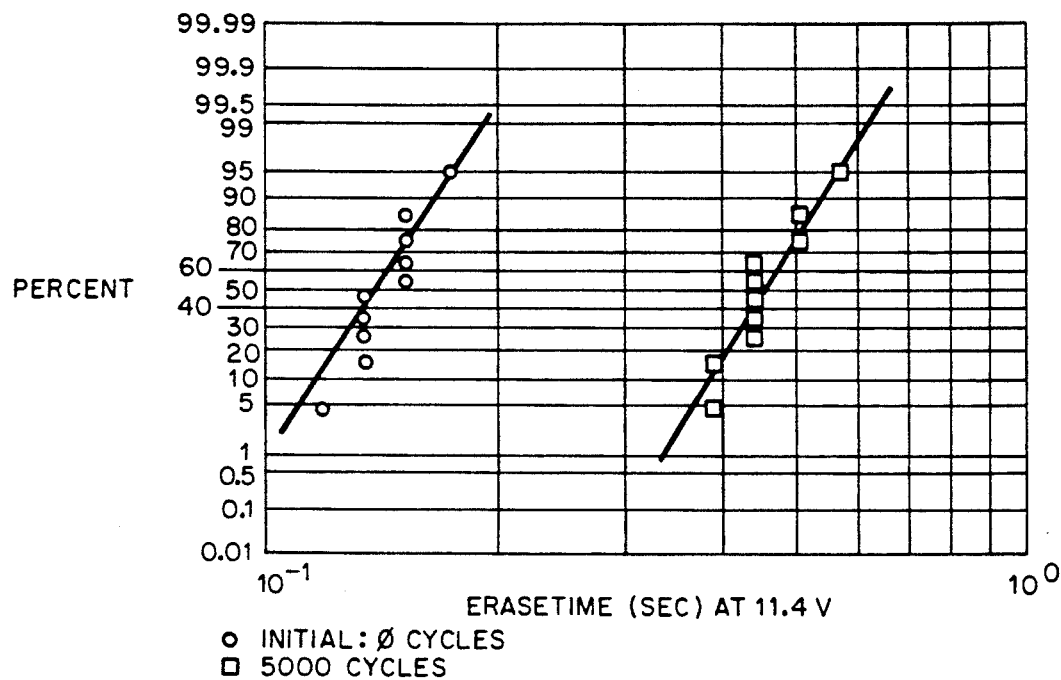
○ INITIAL: Ø CYCLES
□ 5000 CYCLES
FIG_4B
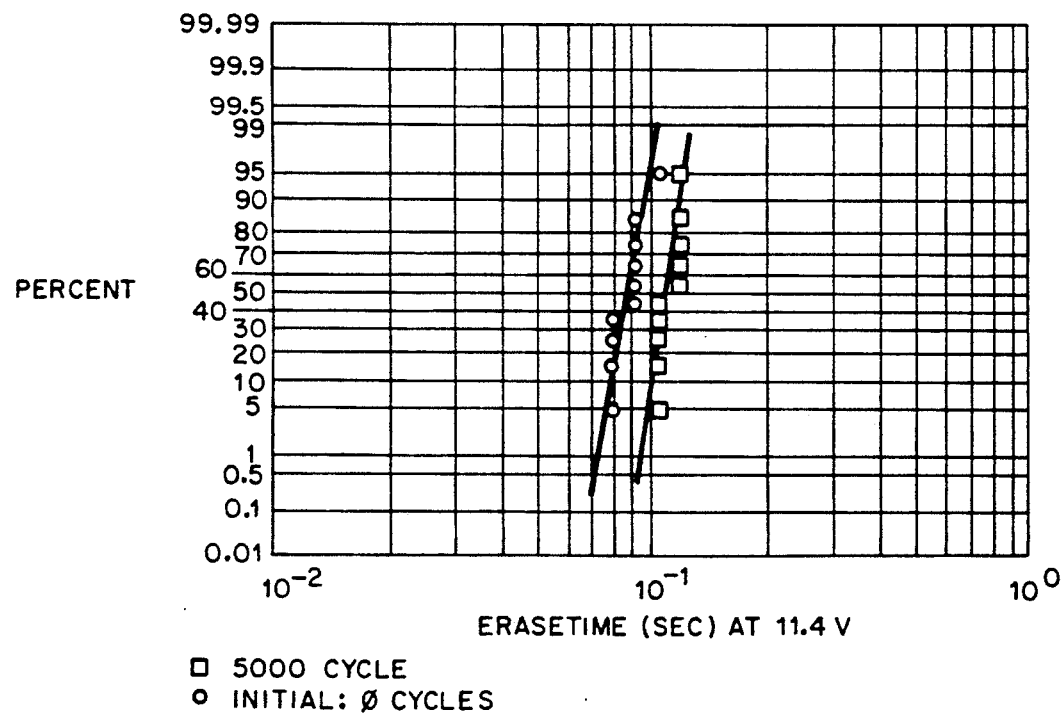
□ 5000 CYCLE
○ INITIAL: Ø CYCLES ized. In fact, in some cases, erasetimes after 100,000 cycles are actually reduced from erasetimes observed when the device is new.

METHOD OF REDUCING HOT-ELECTRON DEGRADATION IN SEMICONDUCTOR DEVICES

This is a continuation of application Ser. No. 07/327,302, filed Mar. 22, 1989, now abandoned.

FIELD OF THE INVENTION

The invention relates to the field of fabricating electrically programmable and electrically erasable memory cells; particularly those cells which experience hot-electron degradation effects.

BACKGROUND OF THE INVENTION

Hot-electron induced n-channel MOSFET degradation has become a serious concern in present and future VLSI circuits due to the ever-increasing channel electric field in scaled devices. Hot-carrier degradation effects are especially crucial to the reliability of those devices which rely on electrical charge transfer mechanisms such as avalanche injection, channel injection, Fowler-Nordheim tunnelling, hot-electron injection from the substrate, etc. Included in this category of devices are electrically programmable read-only memories (EPROMS) as well as electrically programmable and electrically erasable memories (EEPROMS).

Flash memories (e.g., EEPROMs) are especially sensitive to degradation effects due to the fact that there are a substantial number of hot-electrons generated in each cell during electrical programming and erasing. In these flash memories, hot-electron performance is pushed to extreme limits. For example, during flash memory cycling (i.e., when the device is repeatedly programmed and erased), a significant number of substrate hot-electrons are trapped within the insulating gate oxide layer separating the drain region from the floating gate. The greater the number of cycles that a flash memory device is subjected to, the greater the number of carriers that become trapped in the gate oxide.

Hot-electron degradation effects are often observed in flash memories in two ways. Most noticeably, the erase/programming times for a given memory array are increased far beyond their normal limits. This phenomena is frequently referred to as "erasetime/programtime push-out". This means that as the devices are repeatedly cycled, a greater amount of erase/program time must be allotted for each successive cycle in order to insure that the entire array is completely charged or discharged.

The second way that degradation effects are manifested in a flash memory array is in the form of an excess ("apparent") charge loss which renders the memory devices unreliable. That is, even though the device is initially programmed to an "apparently" correct level, with time that programming level may drop below the limits of reliable operation. This "apparent" charge loss is caused by a shift in the transconductance of the devices after extensive program/erase cycles.

Although the exact mechanism for device degradation is still not known, many studies have indicated that it could be due to hydrogen-related interface state generation. This theory suggests that hydrogen is incorporated into the device structure during various processing steps—including the final annealing step. One source of hydrogen that maybe introduced into the device is the hydrogen-rich passivation layer, which typically comprises some form of oxide or nitride (e.g., oxynitride is commonly used).

Many approaches have been suggested for improving the hot-electron stability in MOS devices. For example, one group of researchers have successfully modified the drain doping profile by grading the drain or employing light-doping levels for the purpose of reducing the channel electric field strength. However, even with the use of these field-reducing structures, hot-electron induced degradation may still persist.

In a paper disclosed in IEDM 88, beginning on page 22, entitled "Improvement of Endurance to Hot-Carrier Degradation by Hydrogen Blocking P-SiO" by S. Yoshida et al., the use of a plasma silicon oxide was proposed as a remedy to the hot-electron problem. The authors believed that a blocking effect against hydrogen may be created by trapping the hydrogen atoms with dangling bonds present in the plasma silicon oxide layer. The plasma silicon oxide was shown to have an excellent capability of trapping and blocking hydrogen.

An alternative technique of performing a final anneal in a nitrogen ambient, rather than in a normal hydrogen ambient, is disclosed in an article by F-C. Hsu et al. entitled "Effective Final Anneal on Hot-Electron Induced MOSFET Degradation", *IEEE Electron Device Letters*, Vol. EDL-6, No. 7, July, 1985. This article reports that hydrogen content in certain devices can be reduced by performing a final anneal in a nitrogen atmosphere. Thus, hot-electron degradation may be suppressed to a negligible level. A lower hydrogen content leads to lower degradation as reported by Hsu et al. These results strongly support the hydrogen model for hot-electron-induced device degradation.

Another technique which teaches using a long nitrogen anneal is disclosed in an article by Shuo-Tung Chang et al., entitled "Reduced Oxide Charge Trapping in Approved Hot-Electron Reliability and Submicrometer MOS Devices Fabricated by Titanium Salicide Process", *IEEE Electron Devices Letters*, Vol. 9, No. 5, May, 1988. The nitrogen anneal is discussed in connection with a titanium salicide (self-aligned silicide) process, which is a new technique to reduce source drain resistance in silicon gate devices. The titanium silicide forms the gate electrode of the device. The authors found that titanium sputtering can cause radiation damage at the silicon-oxide interface by generating interface states, thereby degrading transistor performance. Typically, a hydrogen anneal was performed to remove this radiation damage. The authors discovered that using a nitrogen, rather than a hydrogen, anneal results in lower hot-electron degradation.

Even with the use of some of these above mentioned techniques, hot-electron stress in flash memories remains a very serious problem; particularly where the flash memories are used in extended cycle applications. Here they must have the ability to cycle many times without suffering erasetime push-out or excessive charge trapping in the oxide layer.

As will be seen, the present invention provides a method of fabricating flash memory devices which includes depositing a barrier layer of titanium underlying and generally coincident with, normal metalization layers. This titanium barrier layer is not intentionally converted to silicide and actually forms part of the interconnect metalization material. The inclusion of this barrier layer acts to prevent hydrogen present in the passivation layer from interacting with the continuous charge transfer that occurs in the gate oxide region of the memory devices. Using the method of the present invention, the push-out of erasetimes becomes negligible while the reliability of the flash memory devices is substantially enhanced.

SUMMARY OF THE INVENTION

A method of reducing hot-electron-induced degradation effects in field-effect semiconductor devices is disclosed. The method of the present invention includes depositing a protective barrier metal layer over at least the active regions of the semiconductor device prior to depositing a passivation layer. The barrier metal layer should be composed of a material which has an affinity for hydrogen which presence has been shown to have a deleterious effect on hot-electron devices. The preferred embodiment in titanium layer is deposited to a thickness of 1500 Å and this layer has edges which are coincident with those of the aluminum metalization layer forming the bit line in a memory array. In titanium barrier metal layer contacts drain region of the device thereby providing electrical connection. By using the method taught by the present invention, erasetime push-out and excess charge loss is substantially reduced in flash memory devices.

BRIEF DESCRIPTION OF THE DRAWINGS

The present invention will be understood more fully from the detailed description given below and from the accompanying drawings of the preferred embodiment of the invention, which, however should not be taken to limit the invention to the specific embodiment but are for explanation and understanding only.

FIG. 1 is a cross-sectional view of a flash EEPROM device fabricated to include a barrier metal layer in accordance with the currently preferred embodiment of the present invention.

FIG. 2 is a top view of the flash EEPROM device shown in FIG. 1. FIG. 2 shows the relationship of the barrier metal layer to the aluminum metalization layer in the currently preferred embodiment of the present invention.

FIG. 3a illustrates the margin and voltage threshold shifts for 5000 cycled units following a 250° C. bake for 48 hours. The data for FIG. 3a was obtained from a device fabricated without a barrier metal layer.

FIG. 3b comparatively shows the margin and voltage threshold shifts for 5000 cycled units following a 250° C. bake for 48 hours for devices fabricated using the method of the present invention.

FIG. 4 shows the erasetime push-out in seconds for a group of devices fabricated without a barrier metal layer.

FIG. 4b comparatively shows the erasetime push-out for a group of devices fabricated using the method of the present invention.

DETAILED DESCRIPTION OF THE INVENTION

An improved method of fabricating field-effect devices which reduces hot-electron-induced degradation effects is disclosed. In the following description, numerous specific details are set forth, such as thicknesses, compositions, etc., in order to provide a thorough understanding of the present invention. It will be obvious however, to one skilled in the art that these specific details are not essential to practice the present invention. In other instances, well-known processing steps have not been shown in detail in order not to unnecessarily obscure the present invention.

The memory cell of the present invention is fabricated employing metal-oxide-semiconductor (MOS) technology. The particular processing employed is not critical to the present invention since the present invention is easily adapted to any process aimed at fabricating devices which experience hot-electron degradation effects. In the preferred embodiment, the method of the present invention is used in conjunction with a process for fabricating a flash memory device (i.e., EEPROM) or array which relies on hot-electron injection, or tunnelling, of carriers between the substrate and a floating gate member.

As previously mentioned, repeated cycling of flash memories results in charge loss from the floating gate and a corresponding degradation in device performance. It is believed that this phenomena is caused in part by the introduction of hydrogen into the active regions of the field-effect device. The presence of hydrogen enhances interface state generation and causes device degradation. While most flash memory devices are normally fabricated such that the active and channel regions are covered by an aluminum metalization layer, hydrogen atoms may still diffuse under this metalization layer through the open spaces disposed between the metal lines.

Referring now to FIG. 1, a flash memory cell is shown fabricated using the method of the presently preferred embodiment. The processing steps used to fabricate the flash memory device of FIG. 1 up to the metalization steps are preferably those steps disclosed in co-pending U.S. patent application entitled, "Low Voltage EEPROM Cell", Ser. No. 892,446 filed on Aug. 4, 1986, assigned to the assignee of the present invention and which disclosure is herein incorporated by reference.

Briefly, memory cells of the presently preferred embodiment are fabricated on a p-type silicon substrate 13. A crystal orientation of $<100>$ is used with a relatively lightly-doped substrate (38 to 36 $\Omega$-cm). Using a silicon nitride masking layer, field-oxide (isolation) regions 15 are first defined, then field-oxide is grown to a thickness of approximately 7500 Å.

Following the formation of the field-oxide regions, a high-grade tunnelling oxide 24 is thermally grown above the channel region of the substrate. The thickness of the tunnelling area oxide is approximately 100 Å. After that, a phosphorous-doped polycrystalline silicon (polysilicon) layer 16 is deposited and etched in a pattern of parallel stripes which will subsequently form the floating-gates for each of the memory cells. After a thermally grown dielectric layer 22 is grown over layer 16, a second layer of polysilicon 17 is deposited and etched in parallel stripes which run generally perpendicular to those of layer 16. The second layer 17 defines the control gate for the memory device and is employed as a mask to etch underlying layer 16. Layer 16 forms the floating gate of the device. Control gate member 17 stretches over the active channel region 12 of the cell and extends beyond the tunnelling region to the next cell, thereby forming a word line in an array.

The source and drain regions for the cells are formed after poly 2 layer 17 has been defined. First, an arsenic implant is used to form a relatively shallow source drain region. In the presently preferred embodiment, the implant of arsenic occurs at 60 KeV to a level of $4 \times 10^{15}$ atoms/cm$^2$. The source regions receive an additional phosphorous implant at 60 KeV to a concentration of $6 \times 10^{14}$ atoms/cm$^2$. This forms a relatively deep phosphorous source junction since the phosphorous easily diffuses into the silicon. This implant causes the source side to have a deeper and more gradual dopant concentration gradient than the drain side. Alternatively these regions may be formed by ordinary diffusion steps. As shown in FIG. 1 deeper implantation is used in source region 11 to reduce substrate current during electrical erase. (Region 11 represents a common source within the flash memory array).

After the source and drain regions are formed, a thermal oxide layer 23 is grown over the source/drain and poly gate surfaces. A CVD dielectric film 18 is then deposited on top of the thermal oxide to planarize the device.

To open the drain contact, the device is masked and etched until an area of silicon directly over the drain region is exposed. This becomes drain contact region 14 of FIG. 1. In prior art processes, an aluminum metalization layer 20 is normally deposited over the device to connect the drain regions and forms the bit lines of the memory array. However, according to the method of the present invention, a barrier metal layer 19 is deposited just prior to aluminum deposition. This barrier layer extends completely over the active and channel regions of the device. In the preferred embodiment, barrier metal layer 19 is patterned concurrent with aluminum metal layer 20 so that the edges of layers 19 and 20 are substantially coincident. Alternatively, barrier layer 19 and metal layer 20 may be defined using separate masking steps. Finally, the entire device is passivated by insulating layer 21, which is comprised of an oxynitride in the current embodiment.

Barrier metal layer 19 is comprised of a substance which has an affinity for hydrogen atoms. In this way, barrier metal layer 19 acts as a "block" or "getter" to hydrogen—effectively preventing it from diffusing into the active or channel regions of the device. One common source of hydrogen atoms in any semiconductor process is the passivation layer 21 which typically comprises silicon oxide or oxynitride. Without a barrier metal layer having a certain affinity for hydrogen, hydrogen atoms easily diffuse under the metalization layer (generally at the metalization/field oxide boundary) and then migrate to channel region 12. There they generate interface states that are partially responsible for excess charge loss during cycling.

In the currently preferred embodiment, layer 19 comprises titanium. Other titanium rich compounds such as titanium nitride or titanium tungsten may also be used. Basically, any metal which has an affinity for hydrogen or which presents a sufficient number of dangling bonds with which to entrap hydrogen, may be employed. The thickness of titanium in the preferred embodiment is approximately 1500 Å for a 1 micron thick aluminum layer. It is believed that any thickness greater than 100 Å is sufficient to adequately reduce the degradation effects associated with hot-electron cycling.

As stated, barrier metalization layer 19 is formed just prior to the deposition of metalization layer 20. This barrier metal layer is deposited using any number of well-known deposition techniques. For example, in the preferred embodiment titanium is sputtered onto the wafer. Aluminum is then deposited onto the wafer and both the titanium and aluminum are patterned coincidentally to form interconnect lines (e.g., bit lines).

It should be noted that in some prior art processes, titanium tungsten is deposited in the vicinity of the drain contact for the purposes of preventing aluminum migration into the silicon and providing a low electrical resistance contact to the drain region. However, in those processes the tungsten pattern ordinarily does not extend beyond the edges of the contact opening. Conversely, in the present invention titanium barrier layer 19 extends across the entire active portion of the field-effect device and is formed generally coincident with the aluminum metalization layer 20. This is in accordance with its purpose as a barrier layer to prevent the introduction of hydrogen atoms to the device.

FIG. 2 shows a top view of the flash memory cell shown in FIG. 1. The floating gate member is depicted by cross-hatched region 16, while layer 17, forming the control gate member, is shown forming the word line in the array. Perpendicular to polysilicon word line 17 is the bit line formed by aluminum metal layer 20. The titanium barrier layer is again shown as layer 19. (For purposes of illustration the edges of layers 19 and 20 are shown slightly separated. In the preferred embodiment, both layers are etched simultaneously so that their edges are substantially coincident.) In forming a contiguous sheet or blanket of protective metal over the channel and active regions of the flash memory device, titanium layer 19 substantially reduces the amount of hydrogen which may diffuse into oxide regions 22-24. Thus, barrier layer 19 acts to preserve the integrity of oxide 24 in the tunnelling area between floating gate 16 and drain 10. Using the method taught by the present invention the flash EPROM cells shown in FIG. 1 and 2 may be repetitively cycled without suffering the degradation effects normally associated with hot-electron devices.

While FIG. 2 shows the edges of aluminum metalization layer 20 approximately coincident with the edges of titanium barrier layer 19, it is appreciated that the invention would function equally well if one layer extended beyond the other. Other patterns or relationships between the aluminum and titanium layers are also possible. For purposes of blocking or gettering hydrogen, titanium barrier layer 19 need only adequately cover the active and channel regions of the floating gate device. Therefore, a variety of barrier metal patterns may be employed without detracting from the spirit or scope of the present invention.

Referring now to FIGS. 3a and 3b, margin shift and voltage threshold ($V_T$) shifts are shown for 5000 cycled units following a 250° C. bake for 48 hours. (The 250° bake for 48 hours is a common technique used to accelerate the lifetime of a semiconductor device.) Margin shift is one measure of charge loss that can occur in a flash memory and represents a change in the I-V characteristics of the device. In general, greater margin shift corresponds to greater charge loss in the device. The data for FIG. 3a was taken from a group of devices fabricated using the process described above but without the titanium barrier layer. The devices of FIG. 3b were fabricated identically to those of FIG. 3a, except that the additional step of forming a titanium barrier layer prior to aluminum deposition was included in accordance with the method of the present invention. Comparing FIGS. 3a and 3b, the margin shift for those devices fabricated with a titanium barrier layer is substantially less than those devices fabricated without such a layer. The voltage threshold ($V_T$) shift, another measure of charge loss, is roughly comparable in the two cases. The increased margin shift in the prior art devices implies that there is an increased amount of apparent charge loss in those devices produced without the titanium barrier layer.

Referring to FIGS. 4a and 4b, erasetime push-outs are shown for the same two groups of devices, (i.e., those fabricated without a titanium barrier layer and those fabricated with a titanium barrier layer). The data of FIG. 4a, representing the prior art fabrication process, shows an erasetime push-out which is a factor of about three times greater when compared to those devices fabricated with a titanium barrier (FIG. 4b) after 5000 cycles of approximately 0.4 seconds.

Whereas many alternations and modifications of the present invention will no doubt become apparent to the person of ordinary skill in the art after having read the foregoing description, it is to be understood that the particular embodiment shown and described by way of illustration is in no way intended to be considered limiting. For example, although this disclosure has shown the use of a barrier metal layer of a certain pattern, and extent, other patterns or configurations may also be used without detracting from the spirit or scope of the present invention. Moreover, other elements or compounds may be substituted for titanium. Therefore, reference to the details of the illustrations are not intended to limit the scope of the claims which themselves recite those features regarded as essential to the invention.

Thus, a method of reducing the degradation effects associated with avalanche injection of tunnelling of hot-electrons in a field-effect semiconductor device has been disclosed.

We claim:

1. A method of forming an interconnecting layer in a field-effect semiconductor device, said device having a channel region, a source region, and a drain region, said method comprising the steps of:
   (a) depositing a barrier layer over a semiconductor substrate, said barrier layer having an affinity for hydrogen;
   (b) depositing a metal layer over said barrier layer; and
   (c) patterning said barrier layer such that said barrier layer adequately overlies said channel, said source and said drain regions to block and/or getter hydrogen.

2. The method of claim 1 wherein said barrier layer comprises a compound which includes titanium.

3. The method of claim 1 wherein said barrier layer is selected from the group consisting of titanium, titanium nitride, and titanium tungsten.

4. The method of claim 3, wherein said barrier layer is greater than 100 Å thick.

5. The method of claim 1 further comprising the steps of:
   forming a silicon dioxide layer over said substrate prior to the step of depositing said barrier layer;
   forming a gate member over said silicon dioxide layer; and
   forming a source region and a drain region within said substrate before depositing said barrier layer, wherein said source region and said drain region define said channel region, and wherein said barrier layer adequately overlies said source, said drain and said channel regions to block and/or getter hydrogen and said interconnecting layer makes electrical contact to said source region and/or said drain region.

6. The method of claim 1 wherein said barrier layer underlies a passivation layer over said channel region, said passivation layer comprising silicon oxynitride.

7. The method of claim 1, wherein said interconnecting layer makes electrical contact with electrically programmable and electrically erasable memory cells within a memory array of a flash memory device.

8. The method of claim 7, wherein said barrier layer is selected from the group consisting of titanium, titanium nitride; and titanium tungsten.

9. The method of claim 8, wherein said barrier layer is greater than 100 Å thick.

10. The method of claim 7 wherein said barrier layer adequately overlies said channel, said source, and said drain regions to block and/or getter hydrogen of each of said memory cells in said memory array.

11. The method of claim 10 wherein said barrier layer underlies a passivation layer over said channel region, said passivation layer comprising silicon oxynitride.

12. The method of claim 7, wherein said barrier layer comprises a compound which includes titanium.

13. The method of claim 12 wherein said barrier layer underlies a passivation layer over said channel region, said passivation layer comprising silicon oxynitride.

14. The method of claim 12 wherein said barrier layer adequately overlies said channel, said source, and said drain regions to block and/or getter hydrogen of each of said memory cells in said memory array.

15. The method of claim 14 wherein said barrier layer underlies a passivation layer over said channel region, said passivation layer comprising silicon oxynitride.

16. The method of claim 7 wherein said barrier layer underlies a passivation layer over said channel region, said passivation layer comprising silicon oxynitride.

17. The method of claim 7 further comprising the following steps performed before the step of depositing said barrier layer:
   growing a tunnel oxide layer over said semiconductor substrate;
   forming floating gate members on said tunnel oxide layer; and
   forming a source region and a drain region within said substrate.

18. The method of claim 17, wherein said source region and said drain region define said channel region,
   wherein each floating gate member lies on said tunnel oxide layer over said channel region and at least a portion of said source and drain regions,
   wherein said tunnel oxide layer has a substantially uniform thickness between said floating gate member and said channel region, and
   wherein said barrier layer adequately overlies said source, said drain and said channel regions to block and/or getter hydrogen and said interconnecting layer makes electrical contact to said source region and/or said drain region.

19. The method of claim 18 wherein said barrier layer substantially overlies said channel region of each of said memory cells in said memory array.

20. The method of claim 19 wherein said barrier layer underlies a passivation layer over said channel region, said passivation layer comprising silicon oxynitride.

* * * * *